(12) United States Patent
Li et al.

(10) Patent No.: US 9,741,568 B2
(45) Date of Patent: Aug. 22, 2017

(54) SULFUR DOPING METHOD FOR GRAPHENE

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Tie Li, Shanghai (CN); Chen Liang, Shanghai (CN); Yuelin Wang, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 0 days.

(21) Appl. No.: 15/117,196

(22) PCT Filed: May 20, 2014

(86) PCT No.: PCT/CN2014/077840
§ 371 (c)(1),
(2) Date: Aug. 6, 2016

(87) PCT Pub. No.: WO2015/176220
PCT Pub. Date: Nov. 26, 2015

(65) Prior Publication Data
US 2017/0062219 A1    Mar. 2, 2017

(51) Int. Cl.
H01L 21/22 (2006.01)
H01L 21/38 (2006.01)
H01L 21/04 (2006.01)
C01B 31/02 (2006.01)
C01B 31/04 (2006.01)

(52) U.S. Cl.
CPC ............ H01L 21/041 (2013.01); C01B 31/02 (2013.01); C01B 31/0484 (2013.01)

(58) Field of Classification Search
None
See application file for complete search history.

(56) References Cited

U.S. PATENT DOCUMENTS

2011/0030879 A1*  2/2011  Veerasamy ............ B82Y 30/00
                                              156/99
2011/0030991 A1   2/2011  Veerasamy

FOREIGN PATENT DOCUMENTS

WO    WO 2013/089026    6/2013

\* cited by examiner

*Primary Examiner* — Calvin Choi
(74) *Attorney, Agent, or Firm* — Global IP Services; Tianhua Gu

(57) ABSTRACT

The invention provides a sulfur doping method for graphene, which comprises the steps of: 1) providing graphene and placing the grapheme in a chemical vapor deposition reaction chamber; 2) employing an inert gas to perform ventilation and exhaust treatment in the reaction chamber; 3) introducing a sulfur source gas to perform sulfur doping on the graphene at 500-1050° C.; and 4) cooling the reaction chamber in a hydrogen and inert gas atmosphere. The present invention can perform sulfur doping on the graphene simply and efficiently, the economic cost is low, and large-scale production can be realized. Large area sulfur doping on graphene can be realized, and doping of graphene on an insulating substrate or metal substrate can be carried out directly.

9 Claims, 3 Drawing Sheets

SULFUR DOPING METHOD FOR GRAPHENE

BACKGROUND OF THE PRESENT INVENTION

Field of Invention

The present invention belongs to the field of material technology, and particularly relates to a sulfur doping method for graphene.

Description of Related Arts

Graphene is a plane monatomic thin film material formed by two-dimensional regular hexagonal honeycombed lattice configured by carbon atoms. Because the graphene has a series of properties such as prominent heat-conducting property and mechanical property, high electronic mobility, semi-integer quantum halls effect, etc., it has attracted widely attention in the scientific community and raised research upsurge since its first discovery in 2004.

Graphene is bonded by sp2 hybrid carbon atoms, and has monolayer plane graphite of two-dimensional structure of hexagonal lattice honeycomb, and has extremely high crystal quality and electrical property. As a strict two-dimensional crystal material, the graphene has unique physics property, with a carrier concentration up to 1013 cm-2 and a mobility ratio over 20000 cm2V-1 s-1, thereby providing material basis for the preparation of high performance devices, e.g., transistor, sensor and the like.

The connection among carbon atoms inside the graphene is quite flexible, and when external force is applied to the graphene, the carbon atomic plane will be bended and deformed, such that it is not necessary for rearranging the carbon atoms to adapt to the external force, thereby maintaining its stable structure. The stable lattice structure enables the graphene to have excellent thermal conductivity. Additionally, when electron of the graphene moves in its orbit, a scatter will not occur due to lattice imperfection or introduction of foreign atoms. Since inter-atomic forces are relatively strong, even though surrounding carbon atoms jostle at room temperature, the suffered interference of the electrons inside the graphene is also relatively small. The emergence of graphene has aroused large wave in the scientific community, and it has been found that, graphene features extraordinary conductivity property, strength dozens of times of steel as well as excellent transmittance, and its emergence is expected to cause a revolution in the field of modern electronic technology. In graphene, electron enables to migrate very effectively, while the performance of traditional semiconductors and conductors, e.g., silicon and copper, is far less than that of the graphene. Because of the collision of electron and atom, the traditional semiconductors and conductors release some energy in a manner of heat, and the current general chips of computers may waste 70%-80% of electric energy in such manner, whereas the graphene is totally different that its electron energy will not dissipate, with the result of extraordinary excellent property.

As a zero-band gap semiconductor, graphene can be applied to microelectronic device with an importance premise that its band gap as well as carrier concentration are adjustable, while chemical doping is an effective method for realizing the adjustment. Theoretical calculation indicates that, sulfur doped graphene has significant application prospect in a detection aspect of oxynitride gas. As present, doping methods of graphene mostly focus on N-doping, including preparing N-doped graphene by taking methane and ammonia gas as carbon and nitrogen source at high temperature by using chemical vapor deposition method; and achieving reduction of oxidized graphene and N-doping of graphene by performing high temperature annealing of melamine and oxidized graphene, etc. There are few reports on sulfur doping for graphene, only Gao Hui et al of Lanzhou University have reported that S-doped graphene is prepared on a metal substrate by dissolving elemental sulfur into hexane as a liquid sulfur source by chemical vapor deposition.

SUMMARY OF THE PRESENT INVENTION

In view of the above disadvantages in the prior art, the object of the present invention is to provide a sulfur doping method for graphene, with the result of providing a low economic cost, mass producible sulfur doping method for graphene.

In order to achieve the above object and other related objects, the present invention provides a sulfur doping method for graphene, which at least comprises the following steps of:

1) providing graphene and placing the grapheme in a chemical vapor deposition reaction chamber;

2) employing an inert gas to perform ventilation and exhaust treatment in the reaction chamber;

3) introducing a sulfur source gas to perform sulfur doping on the graphene at 500-1050° C.; and 4) cooling the reaction chamber in a hydrogen and inert gas atmosphere.

As a preferable solution of the sulfur doping method for graphene of the present invention, a metal substrate is taken as a carrier for the graphene to place in the reaction chamber, after step 2), it also comprises a step of a) introducing hydrogen to the reaction chamber at 200~400° C., so as to perform reduction on oxide of surface of the metal substrate.

Further, the hydrogen of step a) has an airflow range of 20~100 sccm.

As a preferable solution of the sulfur doping method for graphene of the present invention, in step 2), ventilation and exhaust time of the inert gas is 10~30 min, with an airflow range of 500~5000 sccm.

As a preferable solution of the sulfur doping method for graphene of the present invention, the sulfur source gas comprises one or two of hydrogen sulfide and carbonyl sulfide Further, the adopted gas for sulfur doping in step 3) comprises inert gas, hydrogen and hydrogen sulfide.

Preferable, it is introduced with argon of 500~1500 sccm, hydrogen of 20~60 sccm, hydrogen sulfide of 1~4 sccm at 400~600° C., to perform doping on grephene for 10~30 min.

As a preferable solution of the sulfur doping method for graphene of the present invention, the adopted gas for sulfur doping in step 3) comprises inert gas, hydrogen and carbonyl sulfide.

Further, it is introduced with helium of 500~1500 sccm, hydrogen of 20~60 sccm, carbonyl sulfide of 0.5~3 sccm at 700~1050° C., to perform sulfur doping for 5~20 min.

As a preferable solution of the sulfur doping method for graphene of the present invention, in step 4), the hydrogen has an airflow range of 10~40 sccm, the inert gas has an airflow of 50~200 sccm.

As stated, the present invention a sulfur doping method for graphene comprising steps of: 1) providing graphene and placing the grapheme in a chemical vapor deposition reaction chamber; 2) employing an inert gas to perform ventilation and exhaust treatment on the reaction chamber; 3) introducing a sulfur source gas to perform sulfur doping on the graphene at 500~1050° C.; and 4) cooling the reaction chamber in a hydrogen and inert gas atmosphere. The present invention has the following beneficial effects:

1) The present invention enables to perform sulfur doping on graphene simply and efficiently, which is low in economic cost, and is capable of mass production.

2) The size of the sulfur doped graphene thin film prepared by the present invention depends on the size of original graphene, so that it is achievable to perform large-area sulfur doping on graphene.

3) The present invention enables to perform doping on graphene on insulating substrate directly, so as to prepare sulfur doped graphene devices; it also enables to perform doping on graphene on metal substrate, wherein the metal substrate can be wet etched very easily, and thus the sulfur doped graphene thin film is easy to be transferred to an insulating substrate to perform subsequent device fabrication.

4) During the preparation process, it enables to control the sulfur doping concentration by adjusting gas flow of the sulfur source gas, so as to achieve the controllable doping of graphene.

Figure 1:
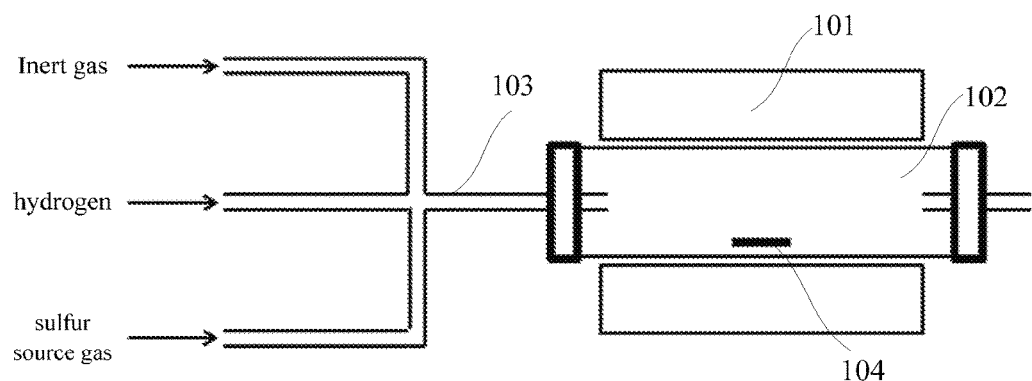
FIG. 1 is shown to a structural diagram of a chemical vapor deposition reaction furnace of a sulfur doping method for graphene of the present invention.

ILLUSTRATION OF ELEMENT LABEL 101 tube furnace
102 quartz tube
103 ventilation path
104 graphene
S11~S15 each step in embodiment 1
S21~S24 each step in embodiment 2

DETAILED DESCRIPTION OF THE PREFERRED EMBODIMENTS

The embodiment modes of the present invention are described hereunder through specific examples, and persons skilled in the art may easily understand other advantages and efficacies of the present invention from the contents disclosed in the present description. The present invention may be further implemented or applied through other different specific embodiment modes, and various modifications or amendments may also be made to each of the details in the present description based on different perspectives and applications without departing from the spirit of the present invention.

Figure 2:
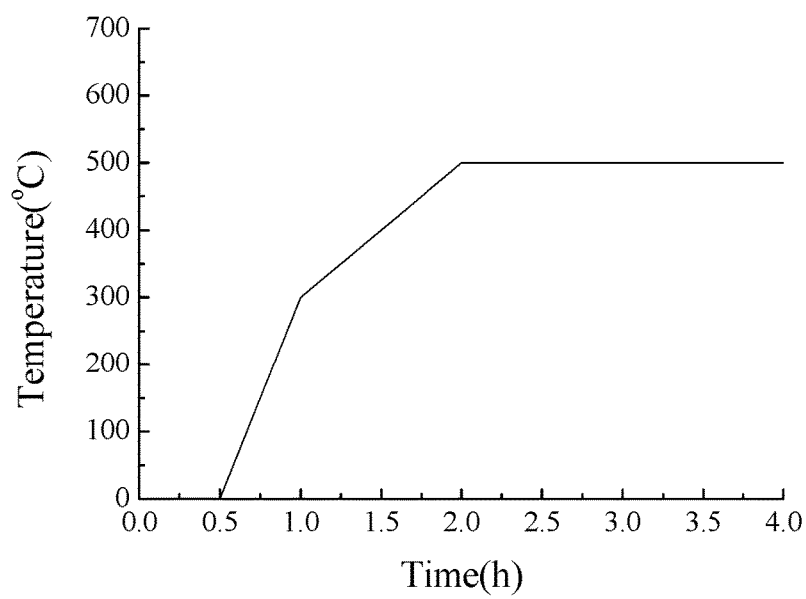
FIG. 2 is shown to a heating rate curve graph of embodiment 1 of a sulfur doping method for graphene of the present invention.
Figure 3:
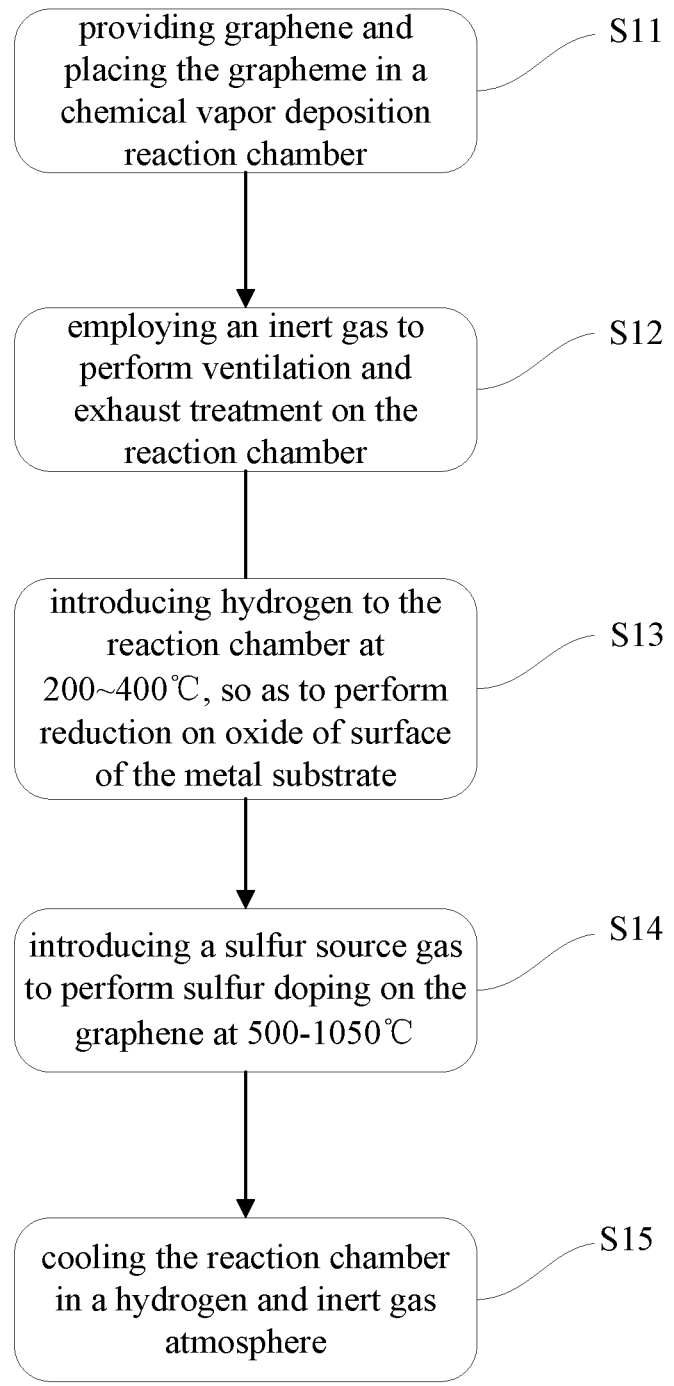
FIG. 3 is shown to a step flow chart of embodiment 1 of a sulfur doping method for graphene of the present invention.
Figure 4:
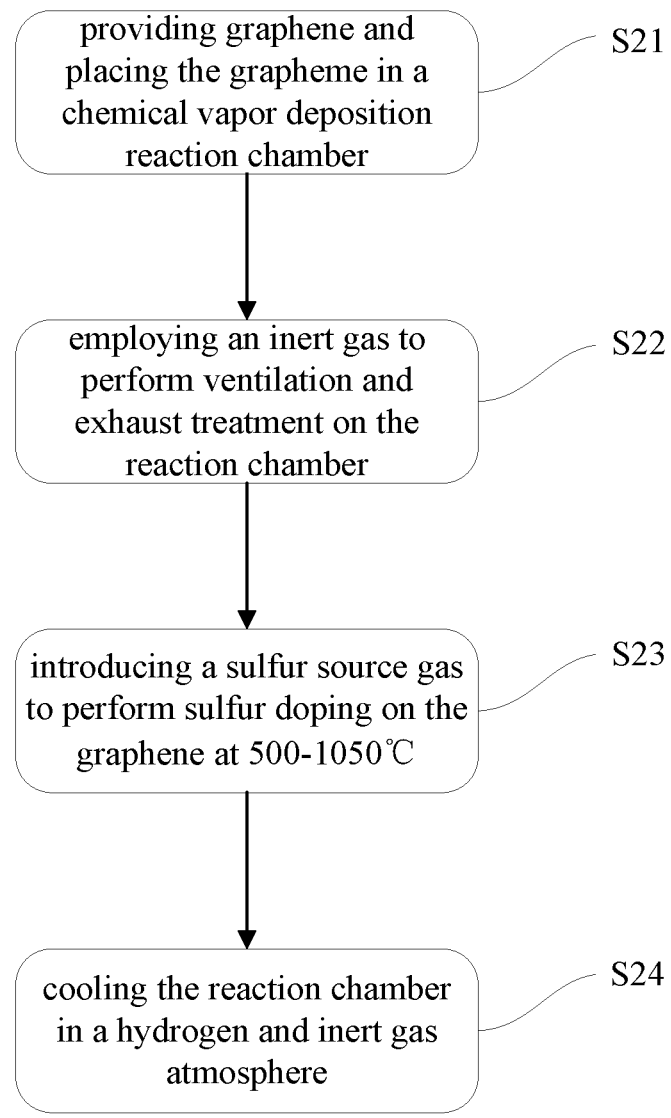
FIG. 4 is shown to a step flow chart of embodiment 2 of a sulfur doping method for graphene of the present invention.

Please refer to FIG. 2 to FIG. 4. It is to be noted that the drawings provided in the present embodiment only explain the basic conception of the present invention in an illustrative manner, so the drawings only display the components relevant to the present invention rather than being drawn according to the number, shape and size of the components during actual implementation, the shape, number and scale of each component may be randomly changed during its actual implementation, and the layout of the components thereof might also be more complicated.

Embodiment 1

As shown in FIG. 1 to FIG. 3, the present embodiment provides a sulfur doping method for graphene, which at least comprises the following steps:

firstly, perform step 1) S11, providing graphene and placing the grapheme in a chemical vapor deposition reaction chamber;

then, perform step 2) S12, employing an inert gas to perform ventilation and exhaust treatment in the reaction chamber;

afterwards, perform step 3) S14, introducing a sulfur source gas to perform sulfur doping on the graphene at 500-1050° C.;

finally, perform step 4) S15, cooling the reaction chamber in a hydrogen and inert gas atmosphere.

As an example, FIG. 1 is shown to the structure of the chemical vapor deposition reaction chamber, which comprises a tube furnace 101, a quartz tube 102 and a ventilation path 103.

As an example, a metal substrate is taken as a carrier for the graphene 104 to place in the reaction chamber, after step 2), it also comprises a step of a) S13 introducing hydrogen to the reaction chamber at 200~400° C., so as to perform reduction on oxide of surface of the metal substrate. In the present embodiment, the metal substrate is copper foil. The copper foil can be easily removed by wet etching after the completion of doping, so that the sulfur doped graphene thin film is easy to be transferred to an insulating substrate to perform subsequent device fabrication.

As an example, the hydrogen of step a) has an airflow range of 20~100 sccm. In the present embodiment, hydrogen of 40 sccm is introduced when the reaction chamber is heated to 300° C., so as to reduce oxide on the surface of the copper foil.

As an example, in step 2), ventilation and exhaust time of the inert gas is 10~30 min, with an airflow range of 500~5000 sccm. In the present embodiment, the reaction chamber is introduced with argon of 1000 sccm and exhaust time of 30 min.

As an example, the adopted gas for sulfur doping in step 3) comprises inert gas, hydrogen and hydrogen sulfide. Specifically, it is introduced with argon of 500~1500 sccm, hydrogen of 20~60 sccm, hydrogen sulfide of 1~4 sccm at 400~600° C., to perform doping on graphene for 10~30 min. In the present embodiment, after the reaction chamber is heated to 500° C., the airflow is adjusted with argon of 1000 sccm, hydrogen of 40 sccm, hydrogen sulfide of 2 sccm, to perform doping on grephene for 15 min.

As an example, in step 4), the hydrogen has an airflow range of 10~40 sccm, the inert gas has an airflow of 50~200 sccm. In the present embodiment, once the doping is completed, the hydrogen sulfide is paused, the argon airflow is adjusted to 100 sccm, and the hydrogen airflow is to 20 sccm, afterwards, then heating is stopped and the temperature of the reaction chamber is naturally cooled to room temperature, so as to obtain the required sulfur doped graphene.

As an example, the heating rate curve in the reaction chamber of the abovementioned process is as shown in FIG. 2.

Embodiment 2

As shown in FIG. 1 to FIG. 4, the present embodiment provides a sulfur doping method for graphene, which at least comprises the following steps:

firstly, perform step 1) S21, providing graphene and placing the grapheme in a chemical vapor deposition reaction chamber;

then, perform step 2) S22, employing an inert gas to perform ventilation and exhaust treatment in the reaction chamber;

afterwards, perform step 3) S23, introducing a sulfur source gas to perform sulfur doping on the graphene at 500-1050° C.;

finally, perform step 4) S24, cooling the reaction chamber in a hydrogen and inert gas atmosphere.

As an example, FIG. 1 is shown to the structure of the chemical vapor deposition reaction chamber, which comprises a tube furnace 101, a quartz tube 102 and a ventilation path 103.

As an example, in step 1), the graphene 104 takes a silicon substrate having an insulating layer as a carrier and is placed in the reaction chamber. The graphene on the insulating substrate can be directly doped, and, once the doping is completed, it can be directly used for preparing sulfur doped graphene devices.

As an example, in step 2), ventilation and exhaust time of the inert gas is 10~30 min, with an airflow range of 500~5000 sccm. In the present embodiment, the reaction chamber is introduced with argon of 2000 sccm and exhaust time of 20 min.

As an example, the adopted gas for sulfur doping in step 3) comprises inert gas, hydrogen and hydrogen sulfide.

Further, it is introduced with argon of 500~1500 sccm, hydrogen of 20~60 sccm, carbonyl sulfide of 0.5~3 sccm at 700~1050° C., to perform doping on grephene for 5~20 min. In the present embodiment, after the reaction chamber is heated to 950° C., the airflow is adjusted with argon of 1000 sccm, hydrogen of 30 sccm, carbonyl sulfide of 1 sccm, to perform doping on grephene for 10 min.

As an example, in step 4), the hydrogen has an airflow range of 10~40 sccm, the inert gas has an airflow of 50~200 sccm. In the present embodiment, once the doping is completed, the hydrogen sulfide is paused, the argon airflow is adjusted to 100 sccm, and the hydrogen airflow is to 20 sccm, afterwards, heating is stopped and the temperature of the reaction chamber is naturally cooled to room temperature, so as to obtain the required sulfur doped graphene.

As stated, the present invention a sulfur doping method for graphene comprising steps of: 1) providing graphene and placing the grapheme in a chemical vapor deposition reaction chamber; 2) employing an inert gas to perform ventilation and exhaust treatment on the reaction chamber; 3) introducing a sulfur source gas to perform sulfur doping on the graphene at 500-1050° C.; and 4) cooling the reaction chamber in a hydrogen and inert gas atmosphere. The present invention has the following beneficial effects:

1) The present invention enables to perform sulfur doping on graphene simply and efficiently, which is low in economic cost, and is capable of mass production.

2) The size of the sulfur doped graphene thin film prepared by the present invention depends on the size of original graphene, so that it is achievable to perform large-area sulfur doping on graphene.

3) The present invention enables to perform doping on graphene on insulating substrate directly, so as to prepare sulfur doped graphene devices; it also enables to perform doping on graphene on metal substrate, wherein the metal substrate can be wet etched very easily, and thus the sulfur doped graphene thin film is easy to be transferred to an insulating substrate to perform subsequent device fabrication.

4) During the preparation process, it enables to control the sulfur doping concentration by adjusting gas flow of the sulfur source gas, so as to achieve the controllable doping of graphene.

Therefore, the present invention effectively overcomes a variety of disadvantages in the prior art and has high industrial utility value.

The abovementioned embodiments only illustratively describe the principle and efficacy of the present invention, rather than being used to limit the present invention. Any person skilled in the art may modify or amend the abovementioned embodiments without departing from the spirit and scope of the present invention. Thus, all equivalent modifications or amendments accomplished by persons having common knowledge in the technical field concerned without departing from the spirit and technical thoughts revealed by the present invention shall still be covered by the claims of the present invention.

What is claimed is:

1. A sulfur doping method for graphene, which at least comprises the following steps of:
   1) providing graphene and placing the grapheme in a chemical vapor deposition reaction chamber;
   2) employing an inert gas to perform ventilation and exhaust treatment in the reaction chamber;
   3) introducing a sulfur source gas to perform sulfur doping on the graphene at 500-1050° C., the sulfur source gas comprises one or two of hydrogen sulfide and carbonyl sulfide; and
   4) cooling the reaction chamber in a hydrogen and inert gas atmosphere.

2. The sulfur doping method for graphene according to claim 1, characterized in that: a metal substrate is taken as a carrier for the graphene to place in the reaction chamber, after step 2), it also comprises a step of a) introducing hydrogen to the reaction chamber at 200~400° C., so as to perform reduction on oxide of surface of the metal substrate.

3. The sulfur doping method for graphene according to claim 2, characterized in that: the hydrogen of step a) has an airflow range of 20~100 sccm.

4. The sulfur doping method for graphene according to claim 1, characterized in that: in step 2), ventilation and exhaust time of the inert gas is 10~30 min, with an airflow range of 500~5000 sccm.

5. The sulfur doping method for graphene according to claim 1, characterized in that: the adopted gas for sulfur doping in step 3) comprises inert gas, hydrogen and hydrogen sulfide.

6. The sulfur doping method for graphene according to claim 5, characterized in that: it is introduced with argon of 500~1500 sccm, hydrogen of 20~60 sccm, hydrogen sulfide of 1~4 sccm at 400~600° C., to perform doping on grephene for 10~30 min.

7. The sulfur doping method for graphene according to claim 1, characterized in that: the adopted gas for sulfur doping in step 3) comprises inert gas, hydrogen and carbonyl sulfide.

8. The sulfur doping method for graphene according to claim 7, characterized in that: it is introduced with helium of 500~1500 sccm, hydrogen of 20~60 sccm, carbonyl sulfide of 0.5~3 sccm at 700~1050° C., to perform sulfur doping for 5~20 min.

9. The sulfur doping method for graphene according to claim 1, characterized in that: in step 4), the hydrogen has an airflow range of 10~40 sccm, the inert gas has an airflow of 50~200 sccm.

* * * * *